US009599677B2

(12) United States Patent
Maeba et al.

(10) Patent No.: US 9,599,677 B2
(45) Date of Patent: Mar. 21, 2017

(54) METHOD FOR DETERMINING COMPLETION OF DISCHARGE OF A WASTE BATTERY AND DETERMINATION DEVICE

(75) Inventors: Kazunari Maeba, Niihama (JP); Ryozo Ushio, Niihama (JP)

(73) Assignee: SUMITOMO METAL MINING CO., LTD., Tokyo (JP)

( * ) Notice: Subject to any disclaimer, the term of this patent is extended or adjusted under 35 U.S.C. 154(b) by 131 days.

(21) Appl. No.: 14/345,605

(22) PCT Filed: Dec. 8, 2011

(86) PCT No.: PCT/JP2011/078400
§ 371 (c)(1),
(2), (4) Date: Mar. 18, 2014

(87) PCT Pub. No.: WO2013/084335
PCT Pub. Date: Jun. 13, 2013

(65) Prior Publication Data
US 2014/0320140 A1    Oct. 30, 2014

(51) Int. Cl.
*G01R 31/36*    (2006.01)
*H01M 6/52*    (2006.01)
(Continued)

(52) U.S. Cl.
CPC .......... *G01R 31/3634* (2013.01); *H01M 6/52* (2013.01); *H01M 10/48* (2013.01); *H01M 10/54* (2013.01);
(Continued)

(58) Field of Classification Search
CPC .................................................. H01M 10/445
See application file for complete search history.

(56) References Cited

U.S. PATENT DOCUMENTS

| 5,597,526 A * | 1/1997 | Nishimura | .............. C22B 7/006 |
| | | | 266/101 |
| 6,163,131 A * | 12/2000 | Gartstein | ................ H02J 7/025 |
| | | | 320/118 |

(Continued)

FOREIGN PATENT DOCUMENTS

| CN | 102074747 A | 5/2011 |
| DE | 19842658 A1 | 4/1999 |

(Continued)

OTHER PUBLICATIONS

Kiyohide, Discharge method of discarded battery, Dec. 2005, translation.*

(Continued)

*Primary Examiner* — Drew A Dunn
*Assistant Examiner* — Tynese McDaniel
(74) *Attorney, Agent, or Firm* — Locke Lord LLP (57) ABSTRACT

Provided is an efficient method for determining the completion of discharging waste batteries, the method being capable of accurately identifying the discharging states of the charge remaining in the waste batteries and appropriately determining the completion of discharging without measuring the residual voltage of each of the waste batteries. The method for determining the completion of discharging waste batteries according to the present invention is characterized in that after immersing the waste batteries in a conductive liquid, the concentration of hydrogen gas produced from the liquid is measured, thereby determining the completion of discharging the charge remaining in the waste batteries.

5 Claims, 4 Drawing Sheets

(51) Int. Cl.
*H01M 10/54* (2006.01)
*H01M 10/48* (2006.01)
H01M 10/052 (2010.01)
H01M 10/44 (2006.01)

(52) U.S. Cl.
CPC ........ *H01M 10/052* (2013.01); *H01M 10/448* (2013.01); *Y02W 30/84* (2015.05)

(56) References Cited

U.S. PATENT DOCUMENTS

| | | | | |
|---|---|---|---|---|
| 6,204,769 | B1* | 3/2001 | Arai | B60L 3/0046 180/65.1 |
| 6,524,737 | B1* | 2/2003 | Tanii | C22B 7/005 429/49 |
| 7,078,122 | B1* | 7/2006 | Rosenberg | C22B 7/007 429/49 |
| 2003/0180604 | A1* | 9/2003 | Zenger | C22B 26/12 429/49 |
| 2009/0291342 | A1* | 11/2009 | Tezuka | H01M 8/04089 429/441 |
| 2010/0012149 | A1* | 1/2010 | Arimura | H01M 10/052 134/3 |
| 2012/0091391 | A1* | 4/2012 | Tsuchida | H01M 6/18 252/182.1 |

FOREIGN PATENT DOCUMENTS

| | | | |
|---|---|---|---|
| EP | 0618633 A1 | 10/1994 | |
| JP | 11-097076 A | 4/1999 | |
| JP | 2005-347162 A | 12/2005 | |
| JP | 2005347162 A | * 12/2005 | ............ H01M 10/54 |
| JP | 2009187761 A | 8/2009 | |
| JP | 2010-277737 A | 12/2010 | |

OTHER PUBLICATIONS

Kiyohide, Discharging method of discarded battery,JP2005347162 Kiyohide machine translation.*
Extended European Search Report issued to EP11876864.7 dated Apr. 23, 2015.
International Search Report of PCT/JP2011/078400.
Chinese Office Action dated Jun. 10, 2015 for Chinese Application No. 201180069425.2.

* cited by examiner

METHOD FOR DETERMINING COMPLETION OF DISCHARGE OF A WASTE BATTERY AND DETERMINATION DEVICE

CROSS-REFERENCE TO RELATED APPLICATIONS

This application is the national phase under 35 U.S,C. §371 of PCT International Application No. PCT/JP2011/078400, filed Dec. 18, 2011, the entire contents of the aforementioned application is hereby incorporated herein by reference.

TECHNICAL FIELD

The present invention relates to a method for determining the completion of discharge of the charge remaining in used batteries or batteries to be disposed of since they are considered as defective products at the time of battery production (hereinafter, collectively referred to as waste batteries).

BACKGROUND ART

In general, since batteries such as lithium ion batteries or nickel hydrogen batteries use valuable materials including rare resources such as cobalt and nickel, when there is a need for disposal because the service life of a battery itself has ended or a battery has been judged to be defective in the production process, batteries are collected, and recycled. Regarding the method for recovering valuable materials from wastes batteries, various methods have been suggested hitherto, and examples thereof include a method of separately recovering various valuable metals by roasting waste batteries, and a method which enables recovery of various valuable metals as well, as recovery of various members such as an organic electrolyte solution, by disassembling waste batteries.

However, in the former method, recovery of valuable materials that are flammable is impossible. Furthermore, in the latter method, if a large amount of charge is remaining in waste batteries, short circuit occurs at the time of disassembling, and there is a risk of explosion or the like. It is desirable if the recovery of valuable materials from waste batteries can be carried out safely. Thus, in order to solve such problems, a method has been suggested for discharging waste batteries in advance before disassembling by immersing the waste batteries in a liquid having conductivity.

For example, Patent Document 1 discloses a method for discharging waste batteries by immersing the waste batteries in an aqueous solution having a weak acid salt of an alkali metal, dissolved therein.

[Patent Document 1] Japanese Unexamined Patent Application, Publication. No. 2005-347162

DISCLOSURE OF THE INVENTION

Problems to be Solved by the Invention

However, Patent Document 1 is described to the effect that completion of discharge can be noticed by the presence or absence of gas generation. However, there is no description or suggestion in connection with the relation between the concentration of generated gas and the residual voltage of waste batteries, that is, the relation between the concentration of generated gas and the completion of discharge. In fact, in the method described in Patent Document 1, the status of discharge of a waste battery cannot be detected with high accuracy, and the completion of discharge cannot be judged unerringly. Therefore, eventually, in order to prevent rupture, ignition or the like in the subsequent crushing treatment, a complicated and inefficient operation for measuring the residual voltage in each one of a large amount of waste batteries, and confirming that the internal voltage has been lowered to or below a safe internal voltage level, has been conducted. Meanwhile, in order to avoid such a complicated operation, a discharging treatment may be carried out by taking an excessively long time; however, since time, space, facilities and the like are used wastefully, the discharging treatment cannot be carried out efficiently.

The present invention was made in view of such circumstances, and an object of the invention is to provide an efficient method for determining the completion of discharge of waste batteries, by which the status of discharge of the charge remaining in waste batteries can be accurately identified, and an appropriate determination of the completion of discharge can be made without measuring the residual voltage of each of the individual waste batteries.

Means for Solving the Problems

The inventors of the present invention conducted investigations in order to solve the problem described above, and realized that when a waste battery is discharged by immersing the waste battery in liquid having conductivity, the concentration of hydrogen gas generated along with discharging decreases as the discharging proceeds. Thus, the inventors further conducted research, and found that by measuring the concentration of the hydrogen gas, the status of discharge of the charge remaining in a waste battery can be identified accurately, and an appropriate determination of the completion of discharge can be made. Specifically, the present invention provides the following.

(1) A method for determining the completion of discharge of a waste battery, the method including immersing a waste battery in a liquid having conductivity, subsequently measuring the concentration of hydrogen gas generated from the liquid, and thereby determining the completion of discharge of the charge remaining in the waste battery.

(2) The method for determining the completion of discharge of a waste battery according to item (1), wherein the waste battery immersed in the liquid having conductivity is subjected to vibration.

(3) The method for determining the completion of discharge of a waste battery according to item (1) or (2), wherein the waste battery is a lithium ion rechargeable battery.

(4) An apparatus for determining the completion of discharge of a waste battery, the apparatus including a waste battery immersion tank that stores a conductive liquid; a hydrogen gas concentration detector that detects the concentration of hydrogen gas generated from the conductive liquid in the waste battery immersion tank; and a means for determining completion of discharge that determines the completion of discharge of a waste battery based on the concentration of hydrogen gas detected by the hydrogen gas concentration detector, wherein the hydrogen gas concentration detector is provided in the space section of the waste battery immersion tank.

Effects of the Invention

According to the method for determining the completion of discharge of a waste battery of the present invention, since the status of discharge of the charge remaining in a waste battery can be identified accurately, appropriate determination of the completion of discharge can be made with high efficiency, without measuring the residual voltage of each one of the waste batteries.

EXPLANATION OF REFERENCE NUMERALS

10 Waste battery
11 Beaker
12 Circular plate
13 Hydrogen as detector
14 Sensor unit
15 Data processing apparatus
16 Net

PREFERRED MODE FOR CARRYING OUT THE INVENTION

Hereinafter, specific embodiments of the present invention will be described in detail, but the present invention is not intended to be limited by the following embodiments, and can be carried out by applying appropriate modification within the intended scope of the present invention.

The method for determining the completion of discharge of a waste battery of the present invention (hereinafter, referred to as a determining method) includes immersing a waste battery in a liquid having conductivity (hereinafter, referred to as conductive quid), subsequently measuring the concentration of hydrogen gas generated from the conductive liquid, and thereby determining the completion of discharge of the charge remaining in the waste battery. When a waste battery is immersed in a conductive liquid, electrolysis occurs due to the residual voltage of the waste battery, and hydrogen gas or oxygen gas is generated from the conductive liquid. In the present invention, attention was paid, among these generated gases, to hydrogen gas, which almost does not exist in the atmosphere, and the concentration thereof was measured; however, it was found that the concentration of hydrogen gas decreases as the discharging reaction of a waste battery proceeds, and at the time point when the charge remaining in the waste battery is discharged to the extent that the battery can be safely subjected to a crushing treatment, the generation of hydrogen gas is not detected. According to the present invention, by measuring the concentration of hydrogen gas generated from the conductive liquid in which waste batteries are immersed, the status of discharge of the charge remaining in the waste batteries can be identified accurately, and the completion of discharge of waste batteries can be appropriately determined. Therefore, there is no need for a complicated and inefficient operation that in order to discharge waste batteries to the extent that the residual charge of the waste batteries can be safely subjected to a crushing treatment, the residual voltage of each of a large amount of waste batteries is measured, and it is confirmed that the internal voltage has decreased to or below a safe level. Furthermore, since it is not necessary for the discharging treatment to take an excessively long time, subsequently time, space, facilities and the like are not used wastefully, and since the elution amount of the electrolyte to the conductive liquid can be suppressed to a minimum level, repeated use of the conductive liquid is enabled, so that decreasing of the effluent loading and the cost can be realized.

In the present invention, completion of discharge means that the charge remaining in a waste battery has been discharged to the extent that the battery can be safely subjected to a crushing treatment. For example, if the residual voltage of a waste battery is 1.8 V or less, the battery can be safely subjected to a crushing treatment without causing rupture or ignition (reference literature: Japanese Patent Application No. 7-105451). Furthermore, in the present invention, a waste battery means a used battery, or a battery to be disposed of since the battery is considered as a defective product at the time of battery production, and conventionally, a battery having charge remaining therein. Here, a used battery includes a battery that is determined to have come to the end of use because of the service life or breakdown of the battery itself as well as the service life or breakdown of the device using the battery. There are no particular limitations on the kind of the battery as an object of the present invention, and examples thereof include rechargeable batteries such as a lithium ion rechargeable battery, a lithium ion polymer rechargeable battery, a nickel hydrogen battery, a nickel cadmium battery, and a small-sized sealed lead battery. Among these, the discharging method of the present invention is preferably applied to a lithium ion rechargeable battery, a lithium ion polymer rechargeable battery and the like, for which discharging before disassembling is particularly highly necessary.

According to the present invention, the conductive liquid for immersing a waste battery is not particularly limited, but for example, a liquid having a conductivity of $10\ \Omega^{-1}\ cm^{-1}$ or higher, such as an aqueous solution of sodium chloride, an aqueous solution of potassium chloride, an aqueous solution of ammonium chloride, an aqueous solution of sulfuric acid, or an aqueous solution of sodium hydroxide is preferably used. In the present invention, among these, an aqueous solution of sodium chloride is more preferred. For example, when an aqueous solution of sulfuric acid or an aqueous solution of sodium hydroxide, which has high conductivity, is used, a large current flows, and the discharging treatment is completed in a short time. However, the amount of heat generation in a short time also increases, and there is en increasing risk of overheating or abrupt boiling, so that there is a high risk at the time of handling. Furthermore, since disposal requires a neutralization treatment, there is also a disadvantage in terms of cost. Furthermore, if conductivity is high, corrosion of electrodes also easily proceeds, so that deterioration of the conductive liquid is also likely to proceed. On the contrary, an aqueous solution of sodium chloride is more preferred from the viewpoint of having a conductivity that is effective and adequate for the present invention, and being easily available and easily handled. As the concentration of the conductive liquid increases, conductivity increases, and the discharge performance is enhanced, which is preferable; however, if the concentration is too high, the cost increases because of excessive performance, and it cannot be said to be preferable. Therefore, the concentration of the conductive liquid may be appropriately set in consideration of the discharge performance and cost. Furthermore, in the case of using an aqueous solution of sodium chloride as the conductive liquid, the discharge reaction proceeds sufficiently at a concentration of about 0.5 mol/L, and the discharge treatment can be completed in a short time.

In the determination method of the present invention, it is preferable to apply vibration to the waste battery immersed in the conductive liquid. Furthermore, the term vibration as used herein also includes vibration based on the application of ultrasonic waves. For example, use may be made of a method of applying ultrasonic waves by placing every conductive liquid in which a waste battery is immersed into an ultrasonic cleaner. In the discharge treatment method of immersing a waste battery in a conductive liquid, a precipitate originating from the external can and the cathode terminal may occur. For example, when the external can of a waste battery is made of iron, there are occasions in which this iron is eluted, and a precipitate of iron hydroxide is produced. If the electrode surfaces of the waste battery are covered with such a precipitate, the discharge reaction is delayed, generation of hydrogen gas occurs with difficulty, and there is a possibility that it may be mistakenly determined that discharge has been terminated. Furthermore, the generated hydrogen gas adheres to the electrode surfaces of the waste battery, so there is a possibility that the discharge reaction may be delayed. Furthermore, there are occasions in which hydrogen gas thus generated may adhere to the outside of the waste battery, and the generated hydrogen gas may not be measured accurately. In addition to that, there is a possibility that in a battery having a hole provided in the terminal section of the cathode, hydrogen gas thus generated may gather at the hole, and the discharge reaction may be delayed. In the present invention, as the waste battery immersed in the conductive liquid is subjected to vibration, the electrode surfaces of the waste battery can be prevented from being covered with a precipitate or generated hydrogen gas, or hydrogen gas adhering to the outside of the waste battery can be released, and by activating the discharge reaction that has been delayed due to any other reason, completion of discharge can be determined more reliably.

In the determination method of the present invention, the conductive liquid in which a waste battery is immersed may be stirred or circulated, in addition to the application of vibration to the waste battery immersed in the conductive liquid. When the conductive liquid is stirred or circulated, similarly to the case of vibrating the waste battery, the electrode surfaces of the waste battery can be prevented from being covered with a precipitate or generated hydrogen gas, or the hydrogen gas that has adhered not only to the external side of the waste battery but also to the inner wall of the container can also be released. Therefore, the hydrogen gas generated cart be measured accurately, and the completion of discharge can be determined more reliably. In addition, stirring or circulation of the conductive liquid in which the waste battery is immersed is also preferable in view of attempting shortening of the discharge time.

The determination method, of the present invention is characterized in that there is correlation between the state of discharge of a waste battery and the concentration of hydrogen gas. Here, the concentration of hydrogen gas varies depending on the discharge conditions. Examples of the cause of variation of the concentration of hydrogen gas include the configuration of the apparatus, the kind, concentration, amount and the like of the conductive liquid, the number of waste batteries, the discharge temperature, the presence or absence of vibration on waste batteries, the presence or absence of stirring or circulation of the conductive liquid, and the sampling amount of the gas collected when the concentration of hydrogen gas is measured. Therefore, in the determination method of the present invention, in an environment set such that at least the causes of variation described above constitute certain conditions, waste batteries are immersed in a liquid having conductivity, the concentration of hydrogen gas generated from the liquid is measured, and the concentration of hydrogen gas at the time point when the charge remaining in the waste batteries has been discharged to the extent that the batteries can be safely subjected to a crushing treatment, is investigated in advance. Thereby, thereafter, as long as the measurement is carried out under the same conditions, the completion of discharge of a waste battery can be determined from the concentration of hydrogen gas generated by using the concentration of hydrogen gas that has been investigated in advance as an index. Therefore, there is no need for a complicated and inefficient operation of measuring the residual voltage of each one of a large amount of waste batteries after the discharge treatment, and confirming that the internal voltage has decreased to or below a safe level. The determination on whether discharge of a waste battery has been completed is not particularly limited, and is based on, for example, the following criteria. The determination may be made on the basis of criteria such as that the detection concentration of hydrogen gas is less than or equal to a certain value for a certain time period; that the detection concentration of hydrogen gas indicates zero for a certain time period; and that the detection concentration of hydrogen gas calculated per waste battery is less than or equal to a certain value for a certain time period.

Since the waste battery that has been discharged by the method of the present invention is discharged to the extent that the battery can be safely subjected to a crushing treatment, after the waste battery is removed from the conductive liquid and washed with water, the waste battery is immediately disassembled, and various valuable metals or various members such as an organic electrolyte solution can be recovered.

Next, the apparatus for determining the completion of discharge of a waste battery of the present invention (hereinafter, referred to as determination apparatus) will be described.

The determination apparatus of the present invention is characterized by including a waste battery immersion tank, a hydrogen gas concentration detector, and a means for determining the completion of discharge. The waste battery immersion tank stores a conductive liquid, and the hydrogen gas concentration detector detects the concentration of hydrogen as generated from the conductive liquid in the waste battery immersion tank. The means for determining the completion of discharge determines the completion of discharge of a waste battery based on the concentration of hydrogen gas detected by the hydrogen gas concentration detector. Furthermore, the hydrogen gas concentration detector is provided in the space section which is an air section where the conductive liquid of the waste battery immersion tank does not exist.

Figure 1:
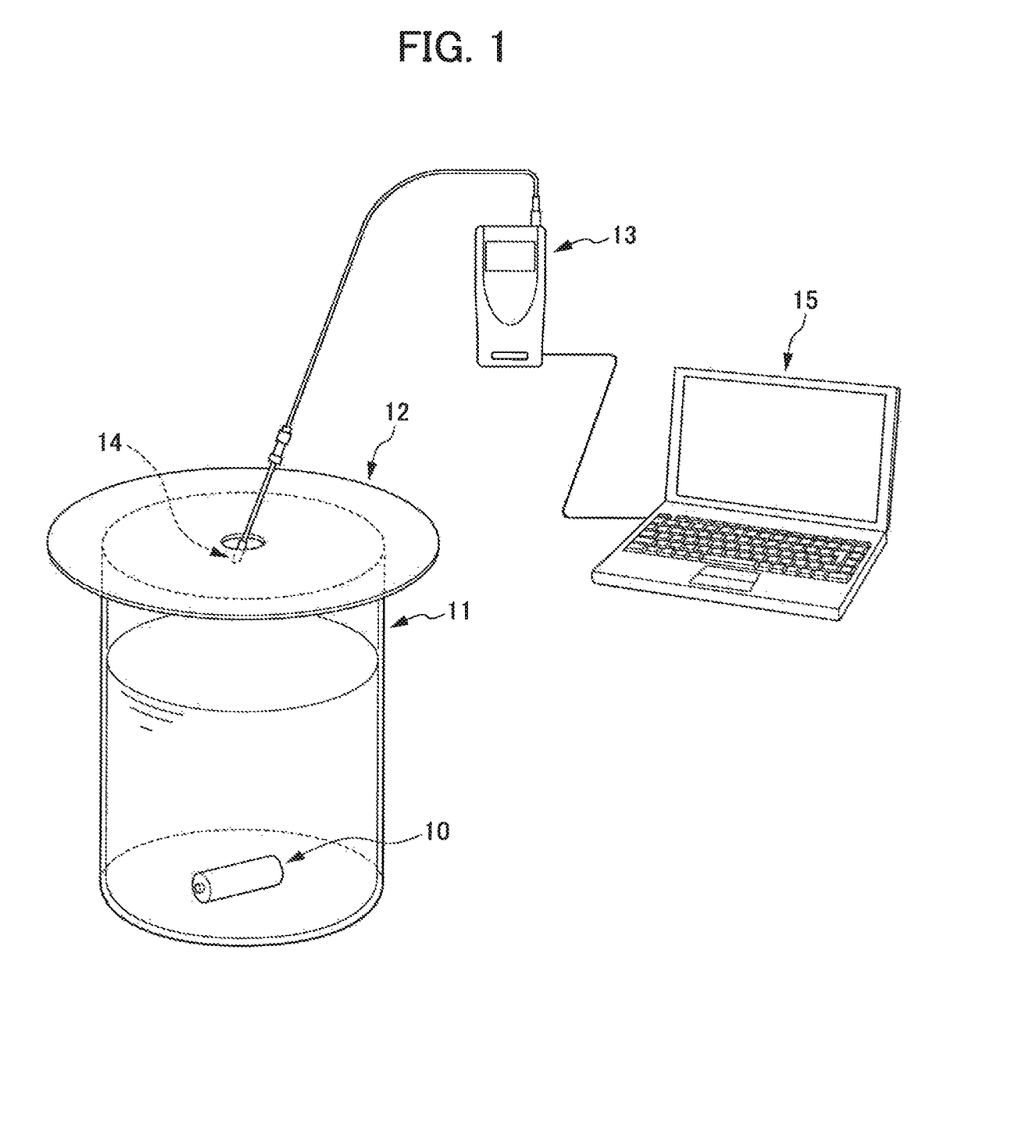
FIG. 1 is a schematic diagram illustrating the apparatus for determining the completion of discharge of waste batteries used in Test Example 1.

FIG. 1 is a diagram illustrating a determination apparatus related to an embodiment of the present invention, which is a determination apparatus used in Test Example 1 of the Examples that will be described below. In FIG. 1, a beaker 11 including a circular plate 12 is a waste battery immersion tank storing the conductive liquid described above. A hydrogen gas detector 13 is the hydrogen gas concentration detector described above and includes a sensor unit 14. A data processing apparatus 15 is a means for determining the completion of discharge as described above. Here, the circular plate 12 is an upper lid of the beaker 11, and has an opening in a section for inserting the sensor unit 14 of the hydrogen as detector 13 into the space section which is an air section where the conductive liquid does not exist inside the beaker 11. The hydrogen gas detector 13 is connected to the data processing apparatus 15.

In the determination apparatus related to an embodiment of the present invention, when a waste battery 10 is inserted into the beaker 11 storing the conductive Liquid, a discharge reaction occurs, and hydrogen gas is generated from the conductive liquid. The hydrogen gas thus generated migrates to the space section which is an air section where the conductive liquid does not exist in the space section formed by the beaker 11 and the circular plate 12. The concentration of this migrated hydrogen gas is detected at the sensor unit 14 of the hydrogen gas detector 13 provided in the space unit. The measurement data of the hydrogen, gas concentration thus detected is transmitted to the data processing apparatus 15, and the completion of discharge of the waste battery 10 is determined based on the hydrogen gas concentration at the time of toe completion of discharge that has been measured in advance.

According to the determination apparatus related to an embodiment of the present invention, the waste battery 10 is inserted into the beaker 11 storing the conductive liquid, the hydrogen can generated in the conductive liquid is caused to migrate to the space section which is an air section where the conductive liquid does not exist in the space section formed by the beaker 11 and the circular plate 12, and the hydrogen gas, in a state in which diffusion into the atmosphere is suppressed, is detected at the sensor unit 14 of tee hydrogen can detector 13. Therefore, the concentration can be measured with higher accuracy. Furthermore, according to the determination apparatus related to an embodiment of the present invention, since the measurement data of the hydrogen gas concentration thus detected are transmitted to the data processing apparatus 15, the hydrogen gas thus generated can be detected continuously or at certain time intervals, and the status of discharge can be identified more accurately. Furthermore, it is also possible to signal the completion of discharge by means of an alarm or the like by inputting the hydrogen gas concentration at the time of the completion of discharge measured in advance, to the data processing apparatus 15, and causing the data processing apparatus 15 to determine the completion of discharge of the waste battery 10.

Meanwhile, the present invention is not intended to be limited to the embodiments described above, and modifications, improvements and the like made to the extent that the purpose of the present invention can be achieved are included in the present invention.

For example, in order to prevent the discharge reaction being delayed due to the adhesion of hydrogen gas to the electrode surfaces of the waste battery 10 or the inner wall of the beaker 11, coating of the waste battery 10 with a precipitate, or the like, and the accuracy of measurement of hydrogen as decreasing, a means for applying vibration to the waste battery 10 and/or the beaker 11 or stirring or circulating the conductive liquid in the beaker 11 may be further included.

EXAMPLES

Hereinafter, the present invention, will be described in more detail by way of Examples, but the present invention is not intended to be limited by these descriptions.

Test Example 1

The concentration of hydrogen gas generated from the conductive liquid in which one waste battery is immersed and the change of the residual voltage of the waste battery were both checked. Meanwhile, the discharge treatment system illustrated, in FIG. 1 was used for the test.

In a beaker 11 having a capacity of 1 liter, 800 ml of an aqueous solution of sodium chloride at a concentration of 1 mol/L was introduced, and then one lithium ion waste battery 10 having a residual voltage of 2.5 V was inserted therein. Here, the temperature of the aqueous solution of sodium chloride was set to room temperature.

Next, a circular plate 12 having an opening at the center (inner diameter of the opening: 3 cm) was attached as an upper lid of the beaker 11, and the mouth of the beaker was closed so that there would be no going in and it of a gas or a liquid through a site other than the opening. Thereafter, a hydrogen gas detector 13 (trade name: high sensitivity flammable gas detector, COSMOTECTER XP-3160, a method for indicating the hydrogen gas concentration: liquid crystal digital display, manufactured by New Cosmos Electric. Co., Ltd.) was attached to the opening. At this time, the hydrogen gas detector 13 was attached so that about 1 cm of the tip of the sensor unit 14 was inserted into the beaker 11 through the opening, and thereby the concentration of the hydrogen gas generated in the beaker 11 and discharged to the outside could be detected. Furthermore, the hydrogen gas concentration detected by the hydrogen gas detector 13 was measured over time. Meanwhile, since the hydrogen gas concentration displayed by the hydrogen gas detector 13 finely varied depending on the reaction inside the beaker 11, the measurement time was divided into intervals of 30 seconds, and the maximum concentration and the minimum concentration of hydrogen gas for the period of 30 seconds were measured. The median value of these concentrations was defined as the hydrogen gas concentration in that time zone. The amount of sampling of the gas was set to be constant (1 liter/for 30 seconds). Furthermore, the upper lid was regularly removed, the waste battery 10 was taken out, and the voltage applied to the cathode and the anode was measured with a tester (trade name: CMD-12D, manufactured by Custom Co., Ltd.), and the change in the residual voltage in waste batteries was investigated. The results of Test Example 1 are illustrated in FIG. 2.

Figure 2:
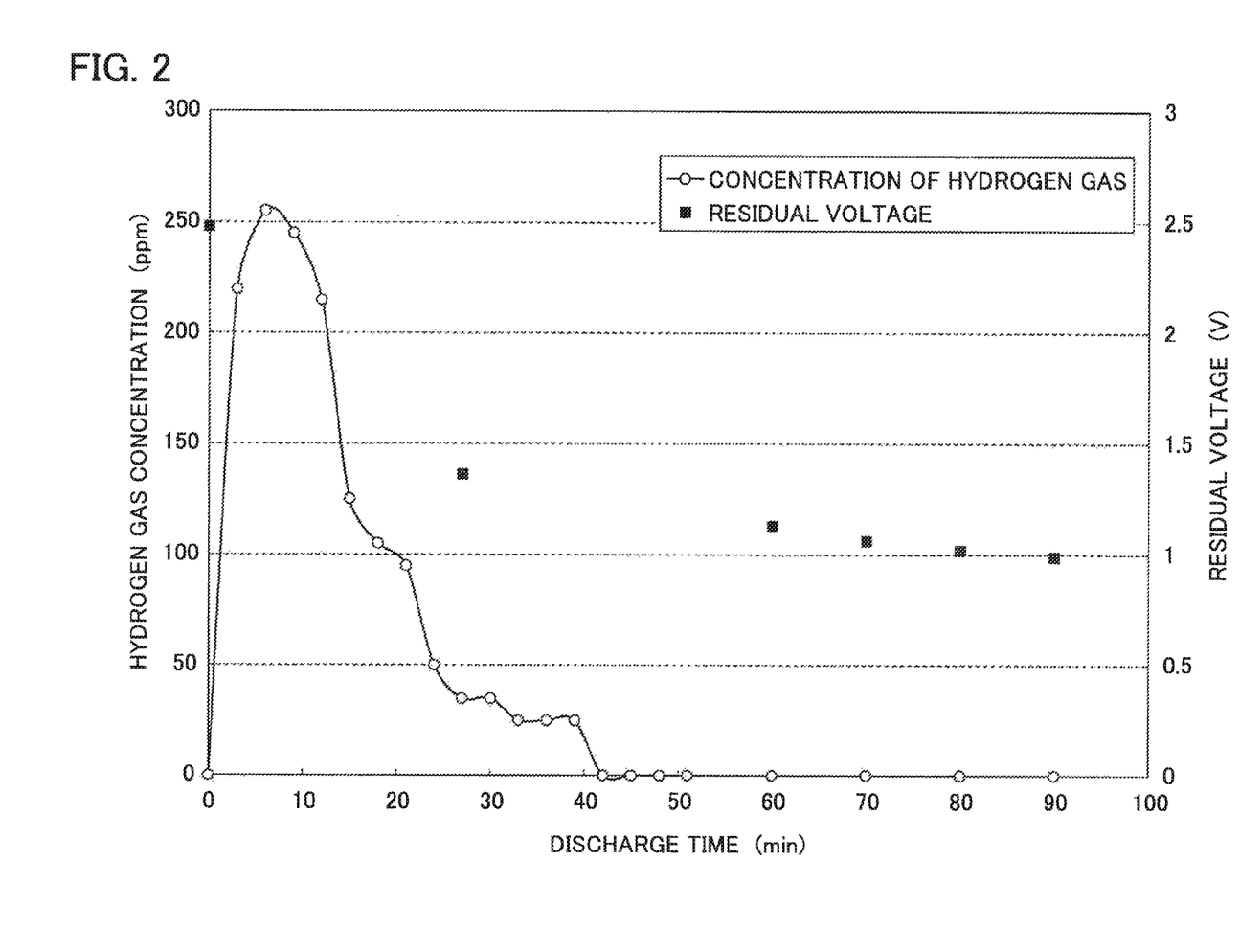
FIG. 2 is a diagram illustrating changes in the hydrogen gas concentration and the residual voltage in Test Example 1.

As illustrated in FIG. 2, the hydrogen gas concentration and the residual voltage in the waste battery decreased with the passage of time, and at the time point where the residual voltage had decreased to about 1.2 V, which was a level without any problem even if the battery were crushed (1.8 V or less), it was confirmed that the system was brought to a situation in which no hydrogen gas was detected, Test Example 2

The concentration of hydrogen gas generated from a conductive lipid in which ten waste batteries were immersed, and the change in the residual voltage of the waste batteries were both checked. Meanwhile, the discharge treatment system illustrated in FIG. 3 was used for the test. Furthermore, in FIG. 3, the same reference symbols as those used in Test Example 1 were assigned to the identical or similar configuration members as those of Test Example 1.

Figure 3:
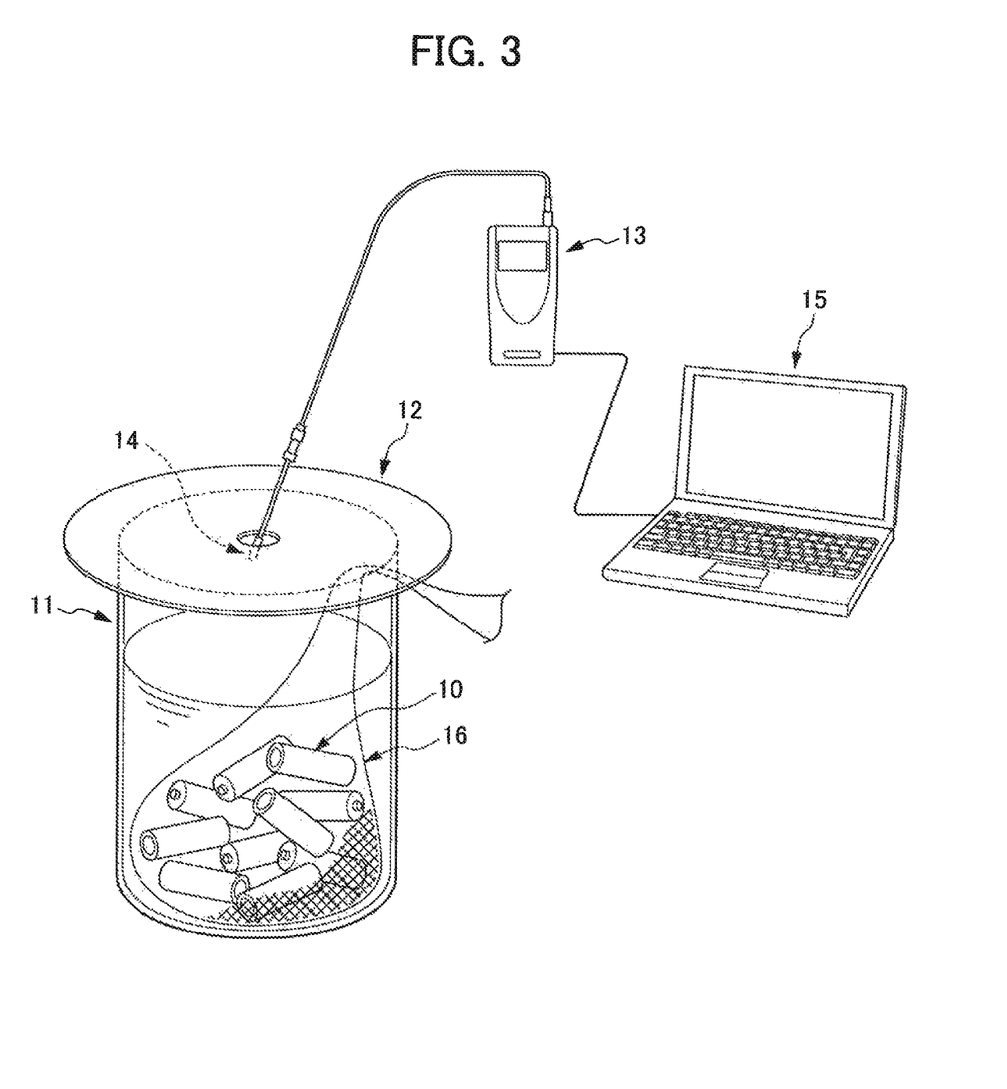
FIG. 3 is a schematic diagram illustrating the apparatus for determining the completion of discharge of waste batteries used in Test Examples 2 and 3.

In a beaker 11 having a capacity of 1 liter, 800 ml of an aqueous solution of sodium chloride at a concentration of 1 mol/L was introduced, and then ten waste lithium ion batteries 10 having a residual voltage of about 4 V, wrapped in a net, were inserted into the aqueous solution. Similarly to Test Example 1, a hydrogen gas detector 13 was attached to the opening of a circular plate 12 attached as an upper lid of the beaker.

The hydrogen gas concentration detected by the hydrogen gas detector 13 was measured over time. Meanwhile, since the hydrogen gas concentration displayed by the hydrogen gas detector 13 finely varied depending on the reaction inside the beaker 11, the measurement time was divided into intervals of 30 seconds, and the maximum concentration and the minimum concentration of hydrogen gas for the period of 30 seconds were measured. The median value of these concentrations was defined as the hydrogen gas concentration in that time zone. The amount of sampling of the gas was set to be constant (1 liter/for 30 seconds). Furthermore, the upper lid was regularly removed, the waste batteries 10 were taken out, and the voltage applied to the cathode and the anode was measured with a tester, and the change in the residual voltage in the waste batteries was investigated. Here, the residual voltage was measured in each of all the ten waste batteries 10 introduced, and the maximum value among them was evaluated. The results of Test Example 2 are illustrated in FIG. 4.

Figure 4:
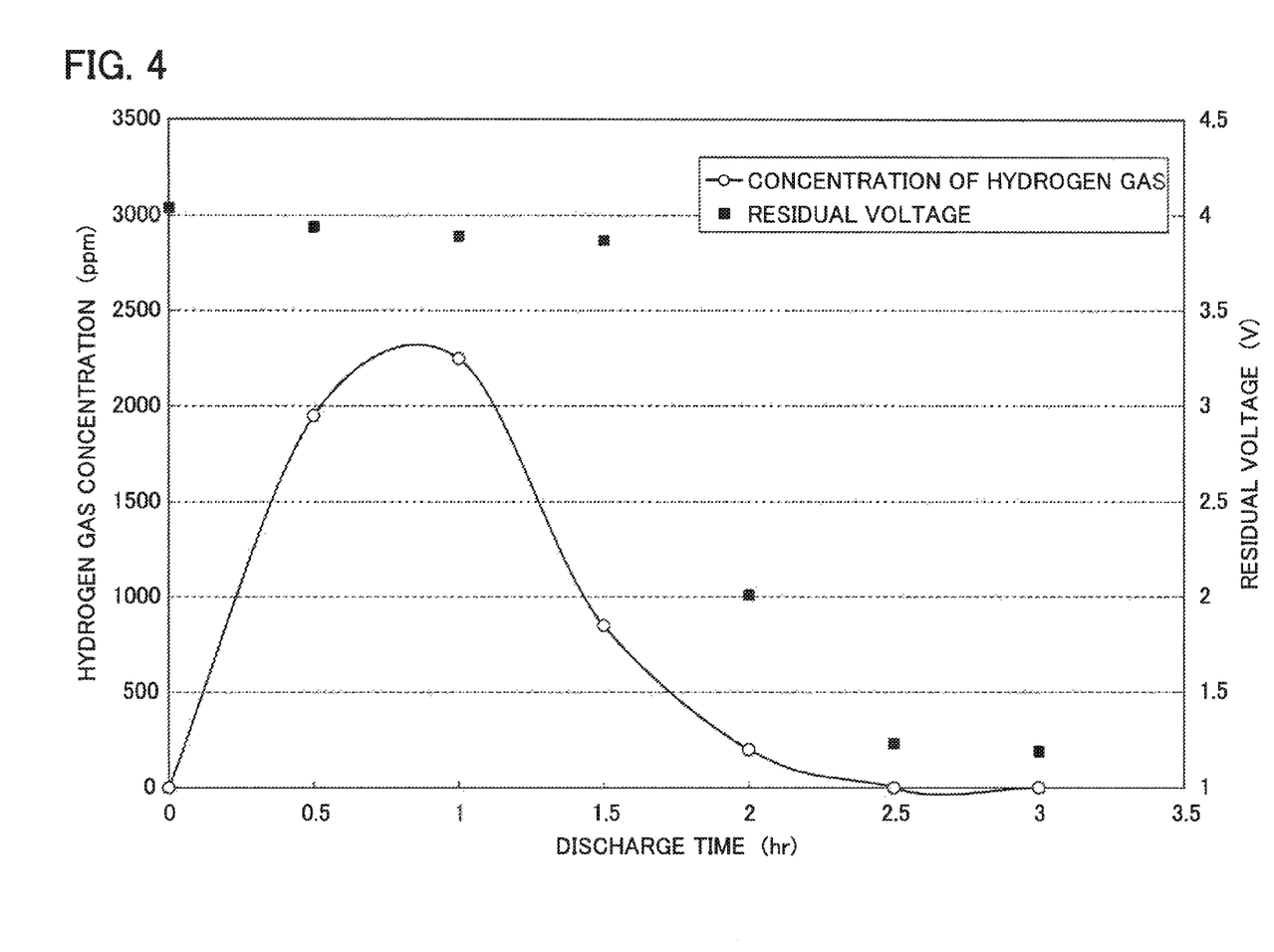
FIG. 4 is a diagram illustrating changes in the hydrogen gas concentration and residual voltage in Test Example 2.

As illustrated in FIG. 4, the hydrogen gas concentration and the residual voltage in the waste batteries decreased with the passage of time, and at the time point where the residual voltage decreased to about 1.2 V, which was a level without any problem even if the batteries were crushed, it was confirmed that the system was brought to a situation in which no hydrogen gas was detected.

Test Example 3

In regard to Test Example 2, after the hydrogen gas concentration detected by the hydrogen gas detector 13 had indicated 0 ppm, the net containing the waste batteries was shaken several times every 10 minutes to apply vibration to the waste batteries, and the hydrogen gas concentration and the residual voltage in the waste batteries were measured. The results are illustrated in Table 1.

TABLE 1

| Discharge time (min) | Hydrogen gas concentration when standing (ppm) | Hydrogen gas concentration when subjected to vibration (ppm) |
|---|---|---|
| 130 | 90 | — |
| 135 | 0 | — |
| 140 | 0 | 200 |
| 150 | 0 | 150 |
| 160 | 0 | 0 |

As illustrated in Table 1, when vibration was applied to the waste batteries after the hydrogen gas concentration had indicated 0 ppm, the detection value of the hydrogen gas detector increased again. This is because when vibration is applied to the waste batteries, the hydrogen gas adhering to the electrode surfaces or interior of the waste batteries was detached, and the discharge reaction that had been delayed was activated.

The operation of applying vibration to the waste batteries was carried out similarly thereafter, and from a certain time, the value of the hydrogen gas concentration sensor did not vary from the state of 0 ppm. At this time point, all of the ten waste batteries exhibited a residual voltage of less than 1 V, which was a level without any problem even if the batteries were crushed.

From the results of Test Examples 1 and 2, it was confirmed that the degree of progress of the discharge reaction could be identified by measuring the concentration of hydrogen gas released from an aqueous solution of sodium chloride in which waste batteries were immersed. Furthermore, from the results of Test Example 3, it was confirmed that the time point at which the discharge reaction was completed could be determined more accurately by applying vibration to the waste batteries. From these results, it became clear that the method for determining the completion of discharge of a waste battery of the present invention can be utilized in the management of the end point of discharge.

The invention claimed is:

1. A method for determining the completion of discharge of a waste battery, the method comprising:
    immersing the waste battery in a liquid having conductivity, and then measuring the concentration of hydrogen gas generated from the liquid;
    obtaining correlation between a state of discharge of the waste battery and the concentration of hydrogen gas at any time point prior to determining the completion of discharge, and;
    determining that the discharge of the charge remaining in the waste battery is completed when the measured value of the concentration of hydrogen gas comes to no more than a predetermined level,
    wherein the predetermined concentration of hydrogen gas, which is the criterion for determining the completion of discharge, is a gas concentration to indicate that the residual voltage in the waste battery comes to no more than a predetermined level that is more than zero, based on the correlation,
    wherein the measurement of the concentration of hydrogen gas is performed with a hydrogen gas concentration detector provided in a space section of a tank in which the waste battery is immersed,
    wherein vibration is applied to the waste battery immersed in the liquid having conductivity, the vibration being applied at predetermined intervals after hydrogen gas is detected at a predetermined level and a value of the concentration of hydrogen gas being measured between the predetermined intervals.

2. The method for determining the completion of discharge of a waste battery according to claim 1, wherein the vibration is vibration based on the application of ultrasonic waves.

3. The method for determining the completion of discharge of a waste battery according to claim 1, wherein the waste battery is a lithium ion rechargeable battery.

4. The method for determining the completion of discharge of a waste battery according to claim 3, wherein the vibration is vibration based on the application of ultrasonic waves.

5. An apparatus for determining the completion of discharge of a waste battery, the apparatus comprising:

a waste battery immersion tank that stores a liquid having conductivity;

a hydrogen gas concentration detector that detects the concentration of hydrogen gas generated from the liquid having conductivity in the waste battery immersion tank; and a data processing apparatus for determining the completion of discharge, which obtains correlation between a state of discharge of the waste battery and the concentration of hydrogen gas at any time point prior to determining the completion of discharge, based on the concentration of hydrogen gas detected by the hydrogen gas concentration detector, and determines that the discharge of the waste battery is completed when the concentration of hydrogen gas is no more than a predetermined level, wherein the hydrogen gas concentration detector is provided in the space section of the waste battery immersion tank, wherein vibration is applied to the waste battery immersed in the liquid having conductivity, the vibration being applied at predetermined intervals after hydrogen gas is detected at a predetermined level and a value of the concentration of hydrogen gas being measured between the predetermined intervals.

* * * * *